(12) United States Patent
Okano

(10) Patent No.: US 8,063,509 B2
(45) Date of Patent: Nov. 22, 2011

(54) POWER SUPPLY VOLTAGE ADJUSTING APPARATUS, RECORDING MEDIUM, AND POWER SUPPLY VOLTAGE ADJUSTING METHOD

(75) Inventor: Hiroshi Okano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 64 days.

(21) Appl. No.: 12/560,785

(22) Filed: Sep. 16, 2009

(65) Prior Publication Data
US 2010/0164286 A1 Jul. 1, 2010

Related U.S. Application Data

(63) Continuation of application No. PCT/JP2007/055671, filed on Mar. 20, 2007.

(51) Int. Cl.
H02J 1/10 (2006.01)
(52) U.S. Cl. .............................. 307/43; 307/72; 307/75
(58) Field of Classification Search .................... 307/43, 307/72–75, 85–87
See application file for complete search history.

(56) References Cited

U.S. PATENT DOCUMENTS

| | | | |
|---|---|---|---|
| 6,864,600 B2 * | 3/2005 | Malinovitch | 307/70 |
| 7,236,035 B2 | 6/2007 | Shiratake et al. | |
| 2004/0145397 A1 * | 7/2004 | Lutkemeyer | 327/158 |
| 2005/0253462 A1 * | 11/2005 | Falkowski et al. | 307/43 |
| 2006/0061401 A1 | 3/2006 | Shiratake et al. | |
| 2006/0232316 A1 | 10/2006 | Nomura | |

FOREIGN PATENT DOCUMENTS

| | | | |
|---|---|---|---|
| JP | 8-136621 | | 5/1996 |
| JP | 11-39868 | | 2/1999 |
| JP | 11-296243 | | 10/1999 |
| JP | 2000035831 A | * | 2/2000 |
| JP | 2001-505676 | | 4/2001 |
| JP | 2002-312058 | | 10/2002 |
| JP | 2004253595 A | * | 9/2004 |
| JP | 2004-362398 | | 12/2004 |
| JP | 2005-100269 | | 4/2005 |
| JP | 2005-115944 | | 4/2005 |
| JP | 2006-86455 | | 3/2006 |
| JP | 2006-93249 | | 4/2006 |
| JP | 2006287163 A | * | 10/2006 |
| JP | 2006293856 A | * | 10/2006 |
| JP | 2006339521 A | * | 12/2006 |
| WO | WO 97/24806 | | 7/1997 |

(Continued)

OTHER PUBLICATIONS

Machine Translations for each of the Japanese Patent Documents.*

(Continued)

Primary Examiner — Fritz M Fleming
(74) Attorney, Agent, or Firm — Staas & Halsey LLP

(57) ABSTRACT

A power supply voltage adjusting apparatus includes a voltage setting part that, according to a characteristic variation of a semiconductor integrated circuit, sets a first power supply voltage of a first power supply domain module among a plurality of modules in the semiconductor integrated circuit, each module respectively having a different power supply voltage; a detecting part that compares phases of a first clock signal flowing through the first power supply domain module and a second clock signal flowing through a second power supply domain module to detect a phase difference; and a voltage adjusting part that adjusts a second power supply voltage supplied to the second power supply domain module to reduce the phase difference detected by the detecting part.

6 Claims, 14 Drawing Sheets

FOREIGN PATENT DOCUMENTS

| WO | WO 98/06022 | 2/1998 |
|---|---|---|
| WO | WO 2005/008777 | 1/2005 |

OTHER PUBLICATIONS

Tschanz, J. et al., *Effectiveness of Adaptive Supply Voltage and Body Bias for Reducing Impact of Parameter Variations in Low Power and High Performance Microprocessors*, IEEE Journal of Solid-State Circuits, vol. 38, No. 5, May 2003, pp. 826-829.

International Search Report, mailed Jun. 19, 2007, in corresponding International Application No. PCT/JP2007/055671.

Form PCT/ISA/237, mailed Jun. 19, 2007, in corresponding International Application No. PCT/JP2007/055671.

International Preliminary Report on Patentability, mailed Sep. 22, 2009, in corresponding International Application No. PCT/JP2007/055671 (8 pp.).

Japanese Patent Office Notice of Rejection mailed Feb. 15, 2011 for corresponding Japanese Patent Application No. 2009-505015.

Japanese Patent Office Notice of Rejection mailed May 17, 2011, for corresponding Japanese Patent Application 2009-505015.

* cited by examiner

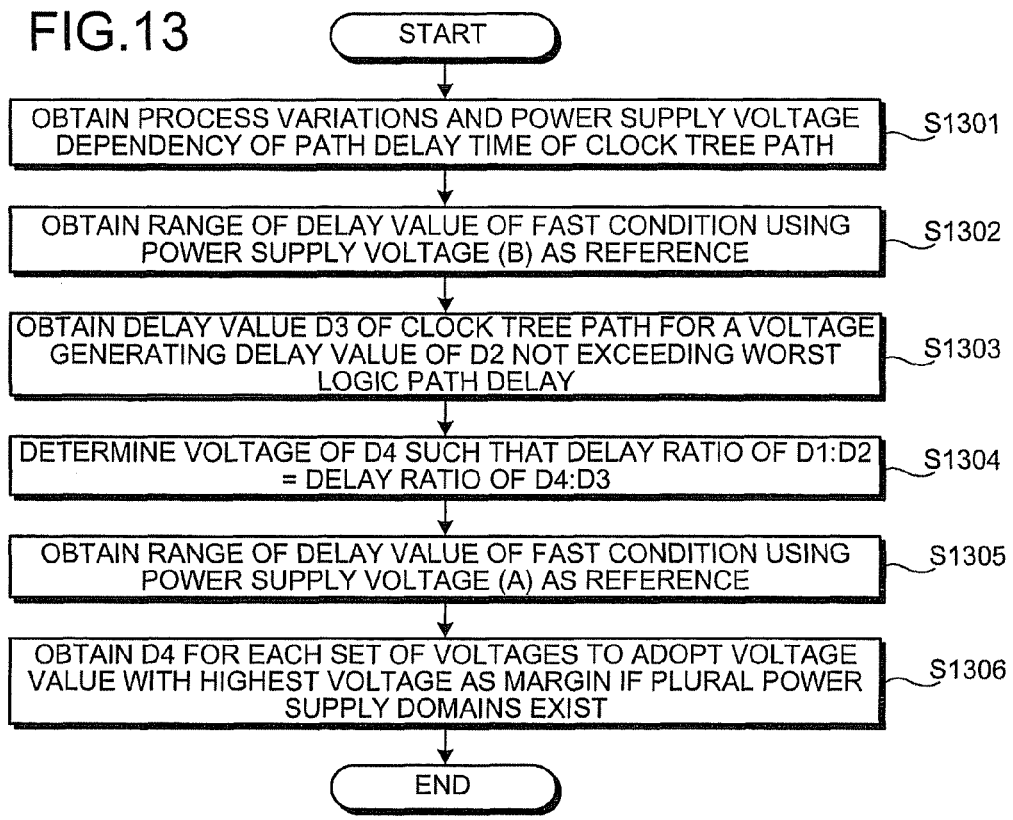
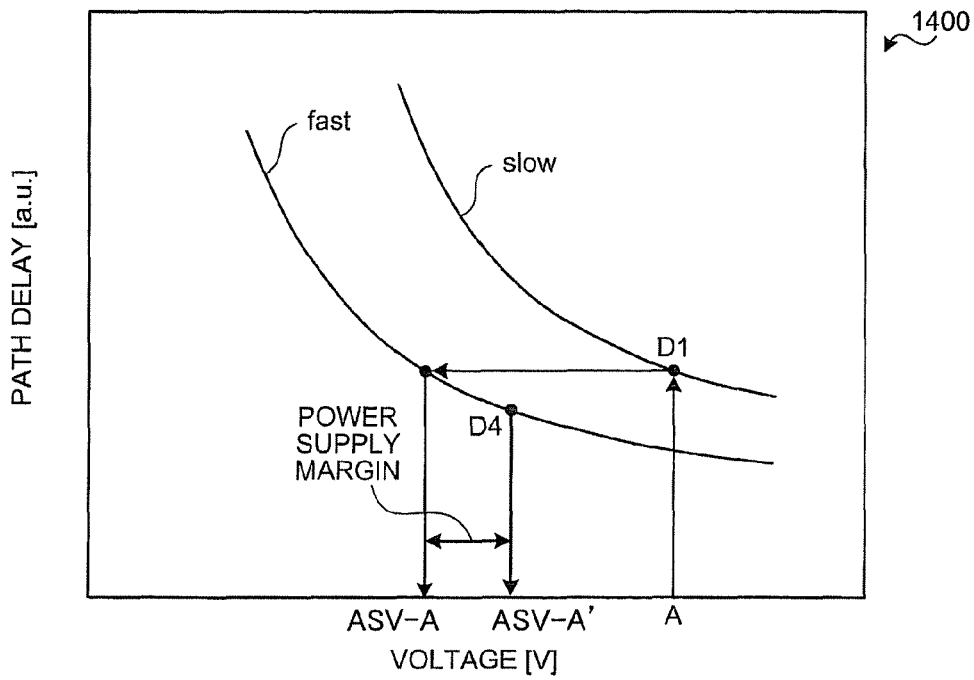

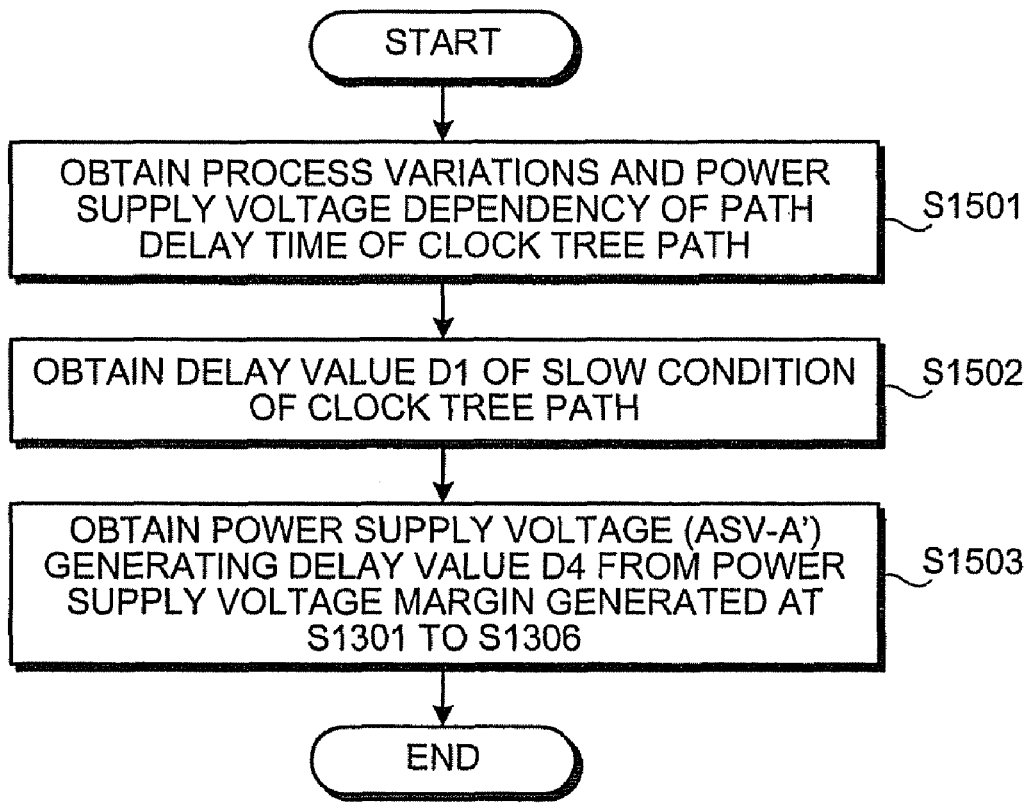

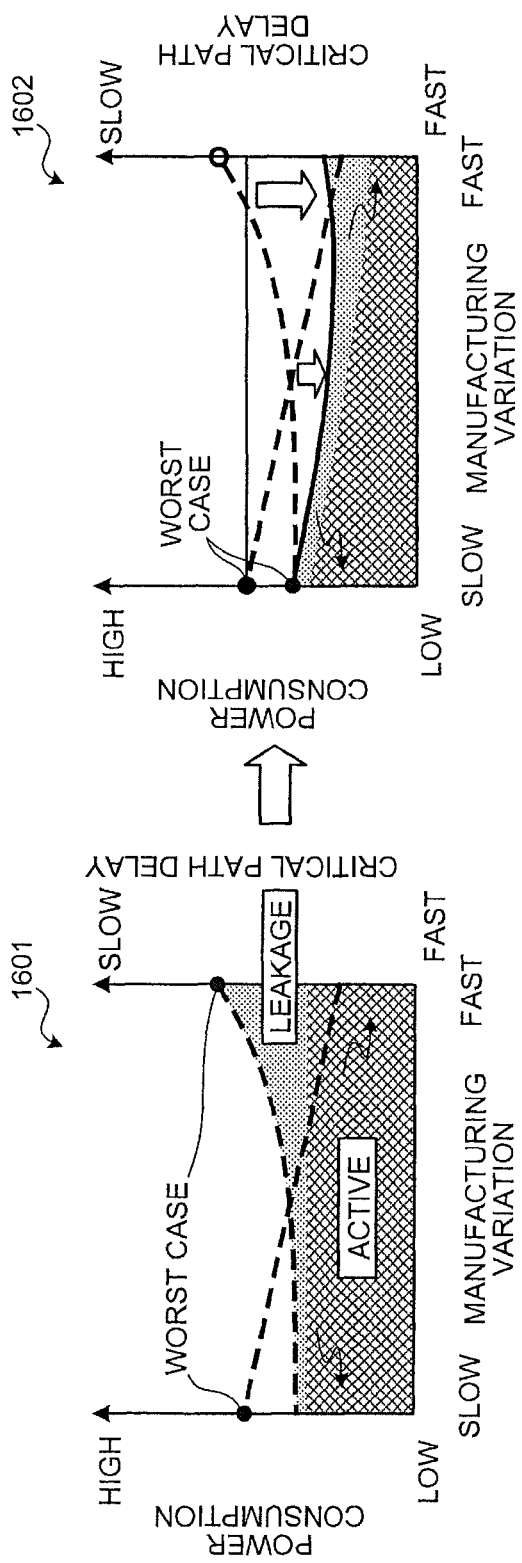

POWER SUPPLY VOLTAGE ADJUSTING APPARATUS, RECORDING MEDIUM, AND POWER SUPPLY VOLTAGE ADJUSTING METHOD

CROSS REFERENCE TO THE RELATED APPLICATIONS

This application is a continuation application of International Application PCT/JP2007/055671, filed Mar. 20, 2007, and designating the U.S., the entire contents of which are incorporated herein by reference.

FIELD

The embodiments discussed herein are related to a power supply voltage adjusting apparatus, a recording medium, and a power supply voltage adjusting method of a semiconductor integrated circuit.

BACKGROUND

Recently, demand for portable devices such as mobile telephones, portable music players, and digital still cameras increases year by year. Since these portable devices are battery-driven, low power consumption is particularly required of LSI used in circuit portions of the portable devices. Further, to achieve cost reductions by reducing heat generating elements, lower power consumption is similarly demanded of LSI in stationary devices.

A multiple power source LSI has been developed to address such demands for lower LSI power consumption. The multiple power source LSI includes multiple modules of power supply domains in the LSI. Therefore, a circuit requiring high-speed operation is disposed in a module supplying a higher voltage and a circuit not requiring high-speed operation is disposed in a module supplying a lower voltage. Thereby, the multiple power source LSI may execute processes satisfying requested performance and achieve lower power consumption.

On the other hand, semiconductor integrated circuits tend to have a longer signal delay time of elements due to manufacturing variations and increased variations in the leakage current accompanying the miniaturization of minimum processing dimensions. If a constant voltage is supplied regardless of the variations of element characteristics, a semiconductor integrated circuit having large manufacturing variation is unable to satisfy an objective operation frequency when the element delay is shifted to a value greater than the design value. When the element delay is shifted to a smaller value, the leak current of the element increases and power consumption increases as a result.

A technique of preventing the increase in the leak current due to process variation is known as an adaptive supply voltage (ASV) technique of adaptively adjusting the power supply voltage depending on the process variation while satisfying an objective operation frequency (see e.g., Tshanz, J.; Narendra, S.; Nair, R.; and De, V., "Effectiveness of Adaptive Supply Voltage and Body Bias for Reducing Impact of Parameter Variations in Low Power and High Performance Microprocessors", IEEE J. Solid-State Circ. Vol. 38, No. 5, pp. 826-829, May 2003).

FIG. 16 is an explanatory diagram of a principle of achieving lower power consumption with the ASV technique. A chart 1601 of FIG. 16 indicates the dependencies of the power consumption on manufacturing variation and the critical path delay for a fixed power supply voltage. A chart 1602 of FIG. 16 indicates the dependencies of the power consumption on manufacturing variation and the critical path delay for the ASV technique.

As depicted in the chart 1601, a chip supplied with a fixed power supply voltage under the fast manufacturing variation condition is supplied with a voltage that is more than necessary regardless of low critical path delay. This excessive supply of the power supply voltage increases the leakage current, resulting in an increase in the power consumption. Therefore, as depicted in the chart 1602, if the power supply voltage is adjusted to be reduced as much as possible within a range of the critical path satisfying the objective operation frequency according to the manufacturing variation, the power consumption may be reduced unless a chip has the slow manufacturing variation condition.

Such an ASV technique is applicable not only to an LSI made up of a single power supply domain module but also to a multiple power source LSI made up of multiple power supply domain modules, for example, by allocating the process variation and the power supply voltage as parameters and performing a delay analysis such as static timing analysis (STA) to obtain the ASV.

FIG. 17 is a block diagram of an exemplary configuration of a conventional single power source LSI. FIG. 18 is a block diagram of an exemplary configuration of a conventional multiple power source LSI. Although a single power supply LSI 1700 may be adjusted through power supply to a power supply domain A by the ASV technique as above, a multiple power supply (triple power supply) LSI 1800 is adjusted appropriately through power supply voltages to power supply domains by the ASV technique taking into consideration logical paths within and between power supply domains A, B, and C.

A circuit has been disclosed that uses a selector to switch a clock signal output from a PLL circuit to suppress clock skew generated when the power supply voltage is changed in some of the cores (see e.g., Japanese Laid-Open Patent Publication No. 2005-100269). A circuit has also been disclosed that, to eliminate malfunction, enables operation voltage sources to be individually set for a first group of circuits that generate clock signals and a second group of circuits that transfer signals and execute logical processing operations according to the clock signals (see e.g., Japanese Patent Application Laid-Open Publication No. 2002-312058).

However, the technology disclosed in Japanese Laid-Open Patent Publication No. 2005-100269 is not suitable for a multiple power source LSI having multiple power supply domains. In the case of a multiple power source LSI, a circuit may be configured across power supply domains of different voltages. When a power supply voltage is obtained according to process variations in the multiple power source LSI, consideration may be given to combinations for each type of the power supply voltages. Therefore, as compared to the single power supply LSI, the number of processes for obtaining the power supply voltage increases considerably.

For example, assuming that the process variation conditions are J conditions, the power supply voltage conditions are K conditions, and the number of power supply domains is L, to obtain the ASV of the power supply domains, the number of times I delay analysis is performed may be expressed by equation (1).

$$I \text{ (number of times delay analysis performed)} = J \times K^L \text{ [times]} \quad (1)$$

Therefore, the number of times delay analysis is performed exponentially increases as the number of power supply domains increases, arising in a problem of heavy processing load on the functional part obtaining the ASV.

Although the clock skew (mismatch of clock timings) of the power supply domains of the multi power supply LSI may be corrected according to Japanese Laid-Open Patent Publication No. 2005-100269, the power supply voltage is not automatically adjustable according to process variations. Similarly, with Japanese Patent Application Laid-Open Publication No. 2002-312058, although the operation voltage sources are individually settable for the first group of circuits that generate clock signals and the second group of circuits that transfer signals and execute logical processing operations according to the clock signals, the power supply voltage is not automatically adjustable according to process variations.

When the ASV of a multiple power source LSI is obtained, the manufacturing variation dependency and the power supply voltage dependency may be different for delay times of a clock tree circuit and a logic circuit due to factors such as a RAM macro, different logic cells, and different transistor types, for example. If the manufacturing variation dependency and the power supply voltage dependency are different for delay times of the clock tree circuit and the logic circuit, malfunction may occur even when the clock skew is corrected.

FIG. 19 is an explanatory diagram of delay times of a clock tree path and a logic path. A chart 1901 of FIG. 19 depicts an example in which the manufacturing variation dependency and the power supply voltage dependency are similar for the delay times of the clock tree circuit and the logic circuit. In such a case, the logic path may be operated at the objective operation frequency by obtaining the AVS based on the characteristics of the clock tree path.

However, if the manufacturing variation dependency and the power supply voltage dependency are different for delay times of the clock tree circuit and the logic circuit, behavior different from the chart 1901 is exhibited. A chart 1902 depicts an example in which the dependency of the logic path delay is smaller. A chart 1903 depicts an example in which the dependency of the logic path delay is greater.

As depicted in charts 1802 and 1803, the manufacturing variation dependency and the power supply voltage dependency may be different for delay times of the clock tree path and the logic path, and the difference may not be negligible in many cases. In particular, as depicted in the chart 1903, when the manufacturing variation dependency of the logic path is greater, if the AVS is obtained based on the characteristics of the clock tree path, a problem arises in that the logic path is unable to operate at the objective operation frequency, causing malfunction.

SUMMARY

According to an aspect of an embodiment, a power supply voltage adjusting apparatus includes a voltage setting part that, according to a characteristic variation of a semiconductor integrated circuit, sets a first power supply voltage of a first power supply domain module among a plurality of modules in the semiconductor integrated circuit, each module respectively having a different power supply voltage; a detecting part that compares phases of a first clock signal flowing through the first power supply domain module and a second clock signal flowing through a second power supply domain module to detect a phase difference; and a voltage adjusting part that adjusts a second power supply voltage supplied to the second power supply domain module to reduce the phase difference detected by the detecting part.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 13 is a flowchart of a power supply voltage margin generating process;

FIG. 14 is a chart for a power supply voltage adjustment technique that takes the power supply voltage margin into consideration;

FIG. 15 is a flowchart of a power supply voltage adjustment process that takes the power supply voltage margin into consideration;

FIG. 16 is an explanatory diagram of a principle of achieving lower power consumption with an ASV technique;

DESCRIPTION OF EMBODIMENTS

Preferred embodiments will be explained with reference to the accompanying drawings.

In a power supply voltage adjustment process according to a first embodiment, it is assumed that a difference of the manufacturing variation dependency and the power supply voltage dependency is within a negligible range for delay times of a clock tree path and a logic path in each of modules.

Figure 1:
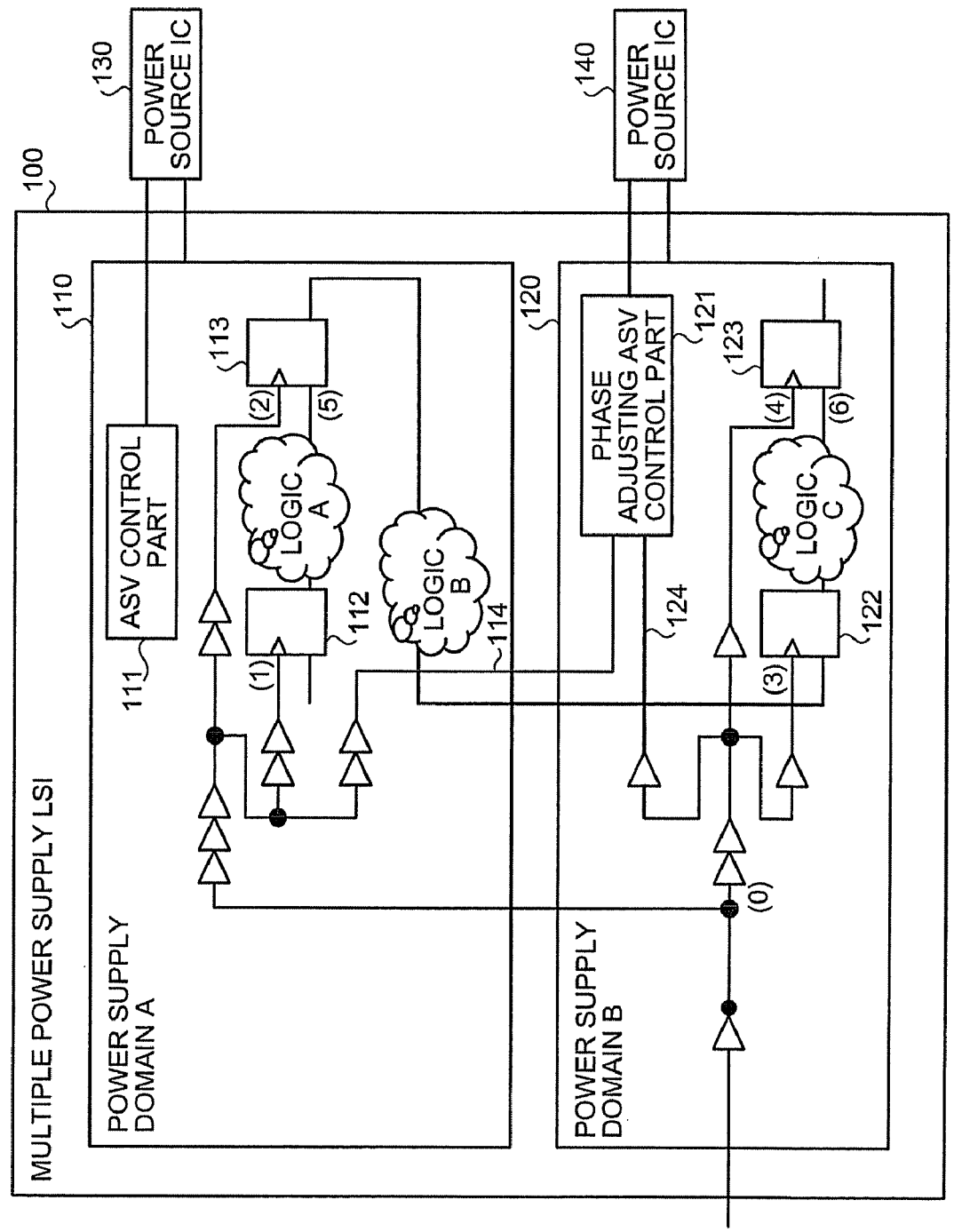
FIG. 1 is a block diagram of a multiple power source LSI according to the embodiment.

FIG. 1 is a block diagram of a configuration of a multiple power source LSI according to the embodiment. As depicted in FIG. 1, a multiple power source LSI 100 according to the embodiment includes a power supply domain A module 110 and a power supply domain B module 120, respectively having different power supply voltages. The power supply domain A module 110 is connected to a power source IC 130 and the power supply domain B module 120 is connected to a power source IC 140.

The power supply domain A module 110 includes an ASV control part 111, registers 112 and 113, a clock tree 114 having a clock buffer within the power supply domain A module 110, and logic circuit logics A and B. The power source IC 130 changes the voltage supplied to the power supply domain A module 110 according to a power supply voltage value output from the ASV control part 111.

The power supply domain B module 120 includes a phase adjusting ASV control part 121, registers 122 and 123, a clock tree 124 having a clock buffer within the power supply domain B module 120, and a logic circuit logic C. The power source IC 140 changes the voltage supplied to the power supply domain B module 120 according to a power supply voltage value output from the phase adjusting ASV control part 121.

Figure 2:
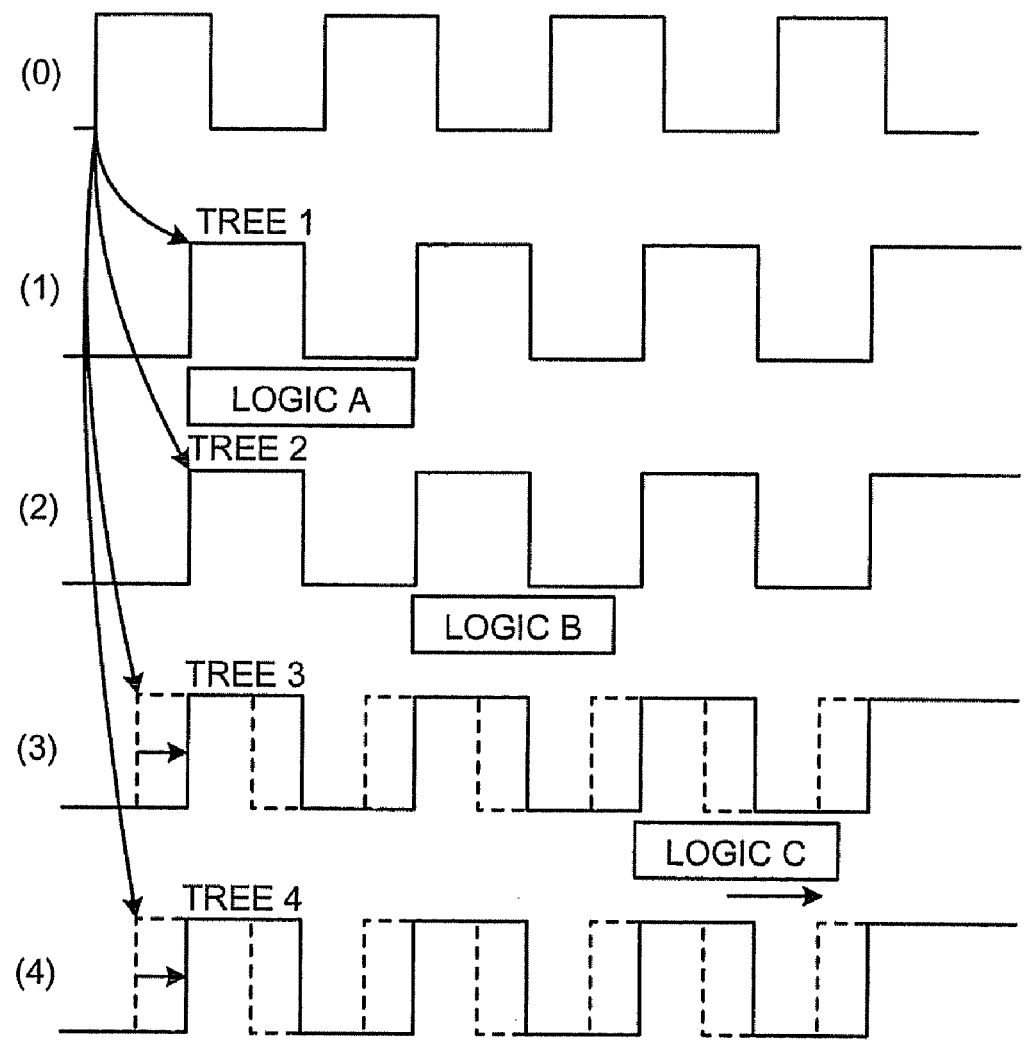
FIG. 2 is a timing chart comparing phases of a clock signal in the multiple power source LSI.

FIG. 2 is a timing chart comparing phases of the clock signal in the multiple power source LSI. FIG. 2 depicts the delay states of the clock signal at points of (1) tree 1, (2) tree 2, (3) tree 3, and (4) tree 4 with respect to the clock signal of the power supply domain B module 120 of the multiple power source LSI 100 at point (0) depicted in FIG. 1.

As depicted in the timing chart of FIG. 2, under a normal state, at the points of (3) tree 3 and (4) tree 4 in the power supply domain B module 120, the clock signal indicated by broken lines is detected and the phase is shifted as compared to the points of (1) tree 1 and (2) tree 2 in the power supply domain A module 110. Therefore, when the power supply voltage of the power supply domain B module 120 is adjusted, the adjustment is performed to eliminate the shift of the phase and achieve the timing of the clock signal indicated by solid lines.

Although a clock signal generating mechanism such as a PLL circuit is not depicted in the multiple power source LSI 100 of FIG. 1, configuration may be such that the clock signal input to the multiple power source LSI 100 is distributed to the power supply domains through a PLL circuit. The configuration may include a divider disposed at the downstream side of the PLL circuit to input clock signals of different clock cycles to the respective power supply domains.

In the multiple power source LSI 100 described above, the ASV control part 111 functions as a voltage setting part and the phase adjusting ASV control part 121 functions as a detecting part and a voltage adjusting part to play the role of a power supply voltage adjusting apparatus.

A procedure will be described for adjusting the voltage supplied to the power supply domain modules of the multiple power source LSI 100 having the configuration above. The multiple power source LSI 100 includes modules of the power supply domains A and B and it is assumed that the reference power supply voltage of the power supply domain A is 1.2 [V] and that the reference power supply voltage of the power supply domain B is 0.8 [V]. The following two-stage process is for adjusting the power supply voltages of these two power supply domain modules:

a first stage of setting the power supply voltage of the power supply domain A module; and a second stage of adjusting the power supply voltage of the power supply domain B module.

Figure 3:
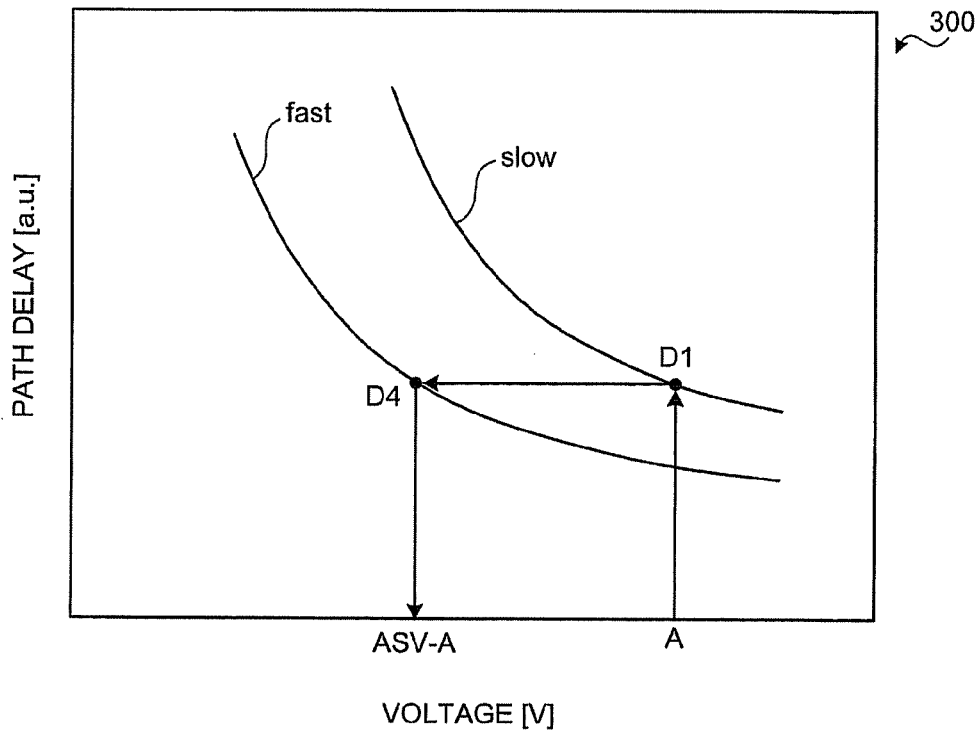
FIG. 3 is a chart for a technique of setting the power supply voltage of a power supply domain A module.

FIG. 3 is a chart for a technique of setting the power supply voltage of the power supply domain A module. A chart 300 of FIG. 3 depicts the power supply voltage dependency characteristics of the path delay in the power supply domain A module 110. The chart 300 depicts the power supply voltage dependency characteristics of the respective process variations.

For example, a characteristic curve "fast" of the chart 300 represents a power supply voltage dependency characteristic under the fast clock tree path condition, and a characteristic curve "slow" represents a power supply voltage dependency characteristic under the slow clock tree path condition. In such a module, a path delay value D1 is generated when a reference power supply voltage (A) is supplied and an adjustment power supply voltage (ASV-A) is defined as a voltage generating a delay value D4 equivalent to the path delay value D1 in the power supply dependency characteristic corresponding to the process variation of the module. In the chart 300, the adjustment power supply voltage (ASV-A) is defined as a voltage when the process variation is under the slow condition.

Figure 4:
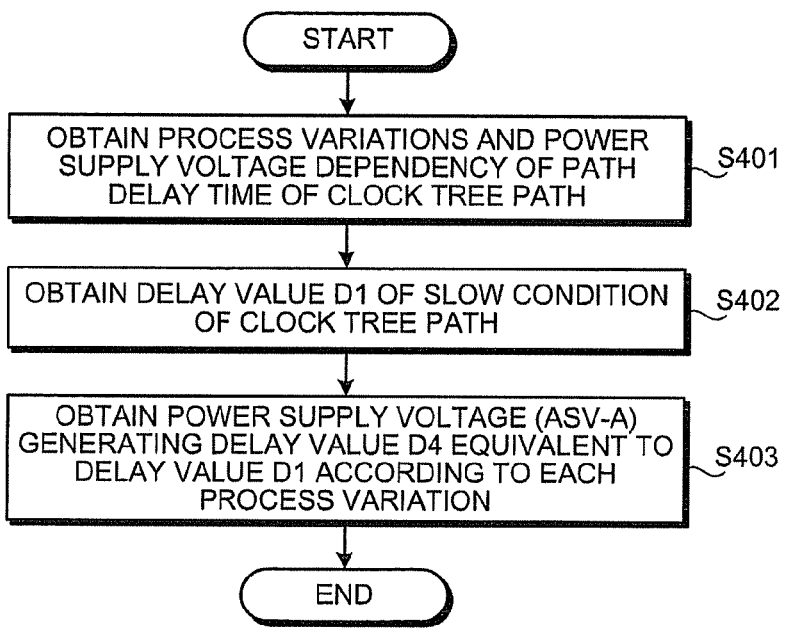
FIG. 4 is a flowchart of a power supply voltage setting process for the power supply domain A module.

FIG. 4 is a flowchart of a power supply voltage setting process for the power supply domain A module. As depicted in the flowchart of FIG. 4, first, the process variations and the power supply voltage dependency of the path delay time of the clock tree path are obtained (step S401). At step S401, to obtain the process variations and the power supply voltage dependency, a circuit simulation may be performed with the use of the design data of the multiple power source LSI 100 or a characteristic test may actually be performed by the multiple power source LSI 100.

The delay value D1 of the slow condition of the clock tree path is then obtained with the reference power supply voltage (A) of the power supply domain A module 110 (step S402) and the power supply voltage (ASV-A) generating the delay value D4 equivalent to the delay value D1 is obtained according to each of the process variations (step S403), ending a series of processes.

Figure 5:
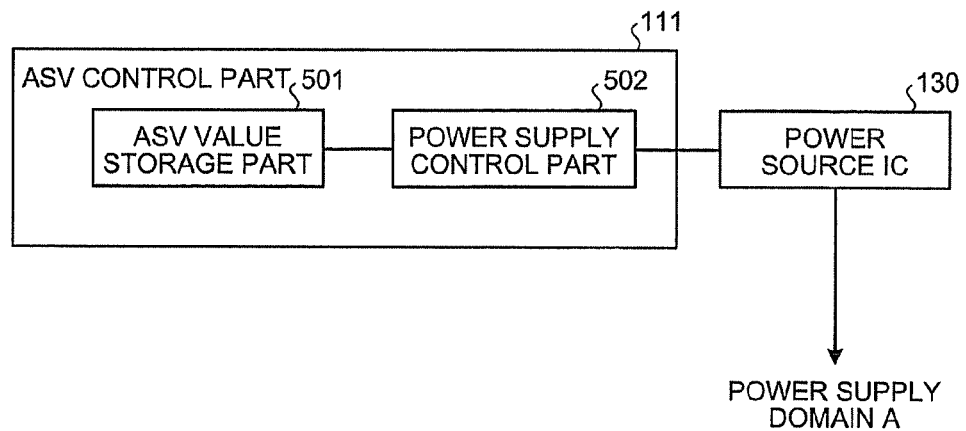
FIG. 5 is a block diagram of a configuration of an ASV control part.

The power supply voltage setting process for the power supply domain A module 110 described in FIGS. 3 and 4 is executed by the ASV control part 111 of the power supply domain A module 110. Therefore, a configuration of the ASV control part 111 included in the power supply domain A module 110 will be described in detail. FIG. 5 is a block diagram of a configuration of the ASV control part. As depicted in FIG. 5, the ASV control part 111 includes an ASV value storage part 501 and a power supply control part 502.

The ASV value storage part 501 stores a value of the power supply voltage (ASV-A) obtained though the above power supply voltage setting process for the power supply domain A module 110. The ASV value storage part 501 stores a power supply voltage (ASV-A') according to a second embodiment described hereinafter. The ASV value storage part 501 may include, for example, a nonvolatile memory and may examine manufacturing variation of a chip, for example, at the time of the LSI test and write a power supply voltage value corresponding to the manufacturing variation at the time of the LSI test. The ASV value storage part 501 may include, for example, a volatile memory and may set a power supply voltage value corresponding to the manufacturing variation at a start-up routine of software when using the multiple power source LSI 100.

The power supply control part 502 reads and outputs the power supply voltage value (ASV-A, ASV-A') stored in the ASV value storage part 501, to the power source IC 130 according to the power supply voltage setting process for the power supply domain A module 110. The ASV control part 111 executes the power supply voltage setting process for the power supply domain A module 110 as described above.

Figure 6:
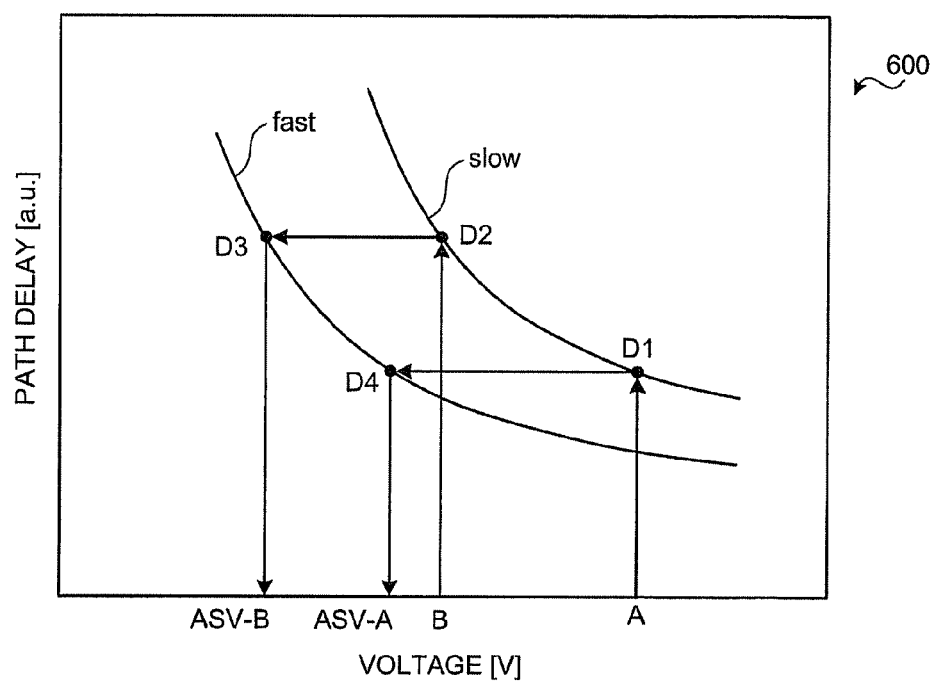
FIG. 6 is a chart for a technique of setting the power supply voltage of a power supply domain B module.

FIG. 6 is a chart for a technique of setting the power supply voltage of the power supply domain B module. A chart 600 of FIG. 6 depicts the power supply voltage dependency characteristics of the path delay in the power supply domain B module 120. Similarly with respect to FIG. 3, the chart 600 depicts the power supply voltage dependency characteristics (characteristic curve fast, slow) of the respective process variations.

In the power supply voltage adjustment of the power supply domain B module 120, first, the adjustment power supply voltage (ASV-A) is set through the power supply voltage setting process for the power supply domain A module 110 as described with reference to FIGS. 4 and 5. Subsequently, the voltage of the reference power supply voltage (B) is adjusted to synchronize the clock signal of the power supply domain A module 110 and the clock signal of the power supply domain B module 120. The voltage at which the clock signals synchronize is used as the adjustment power supply voltage (ASV-B).

As the path delay characteristic is maintained even when the power supply voltage of the power supply domain A module 110 is set from the reference power supply voltage (A) to the adjustment power supply voltage (ASV-A) by synchronizing the clock signals, when the power supply domain B module 120 power supply voltage is adjusted from the reference power supply voltage (B) to the adjustment power supply voltage (ASV-B), at a delay value D3 the path delay characteristic at the delay value D2 retained, as depicted in a chart 600 of FIG. 6.

Figure 7:
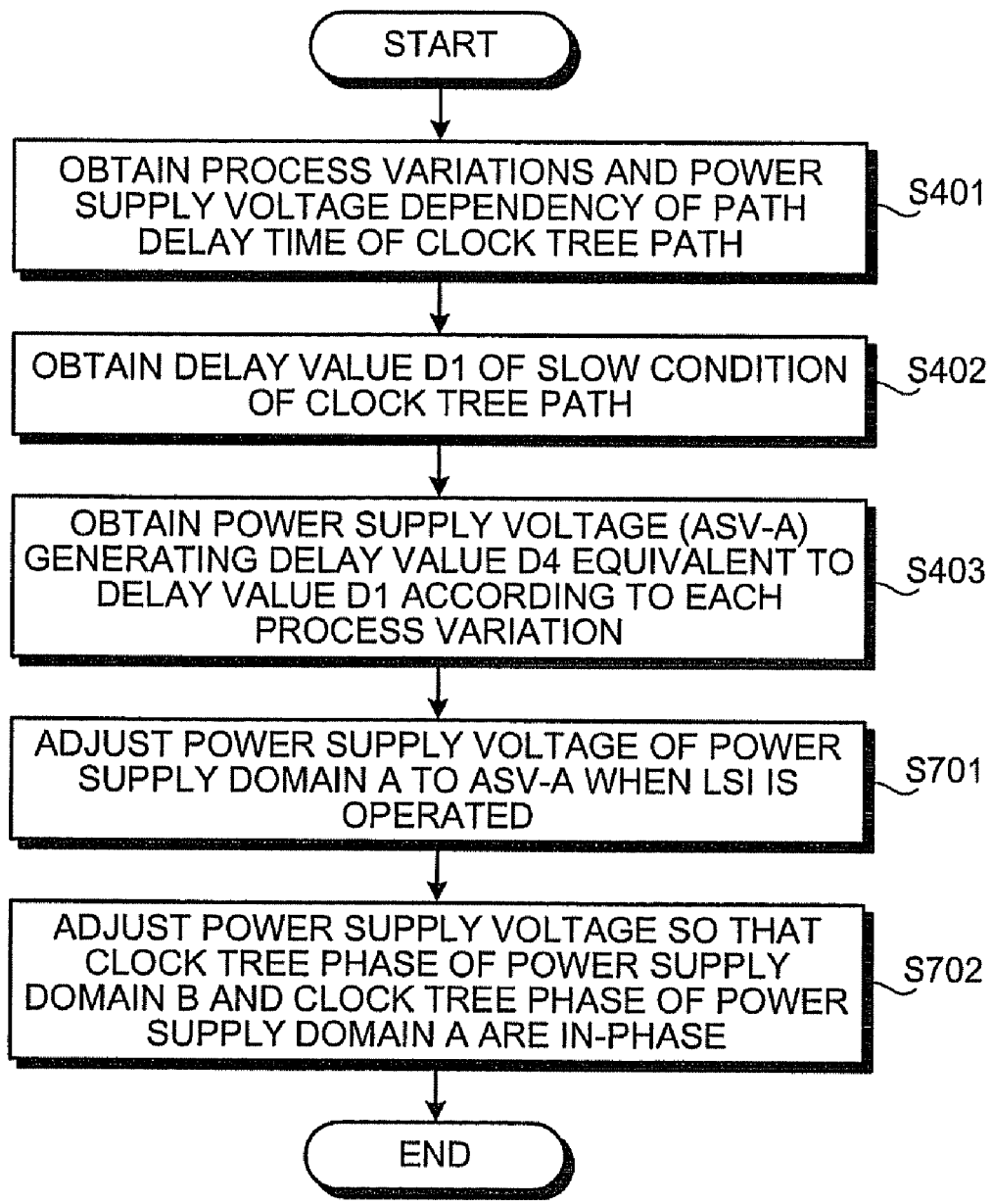
FIG. 7 is a flowchart of a power supply voltage adjustment process for the power supply domain B module.

FIG. 7 is a flowchart of a power supply voltage adjustment process for the power supply domain B module. As depicted in the flowchart of FIG. 7, first, the power supply voltage of the power supply domain A module 110 is set by executing the processes at steps S401 to S403 described with reference to FIG. 4.

When the LSI (multiple power source LSI 100) is operated, the power supply voltage of the power supply domain A is adjusted to ASV-A (step S701). The power supply voltage supplied to the power supply domain B module 120 is adjusted so that the clock tree phase of the power supply domain B module 120 and the clock tree phase of the power supply domain A module 110 are in-phase (step S702), and ending a series of processes.

Figure 8:
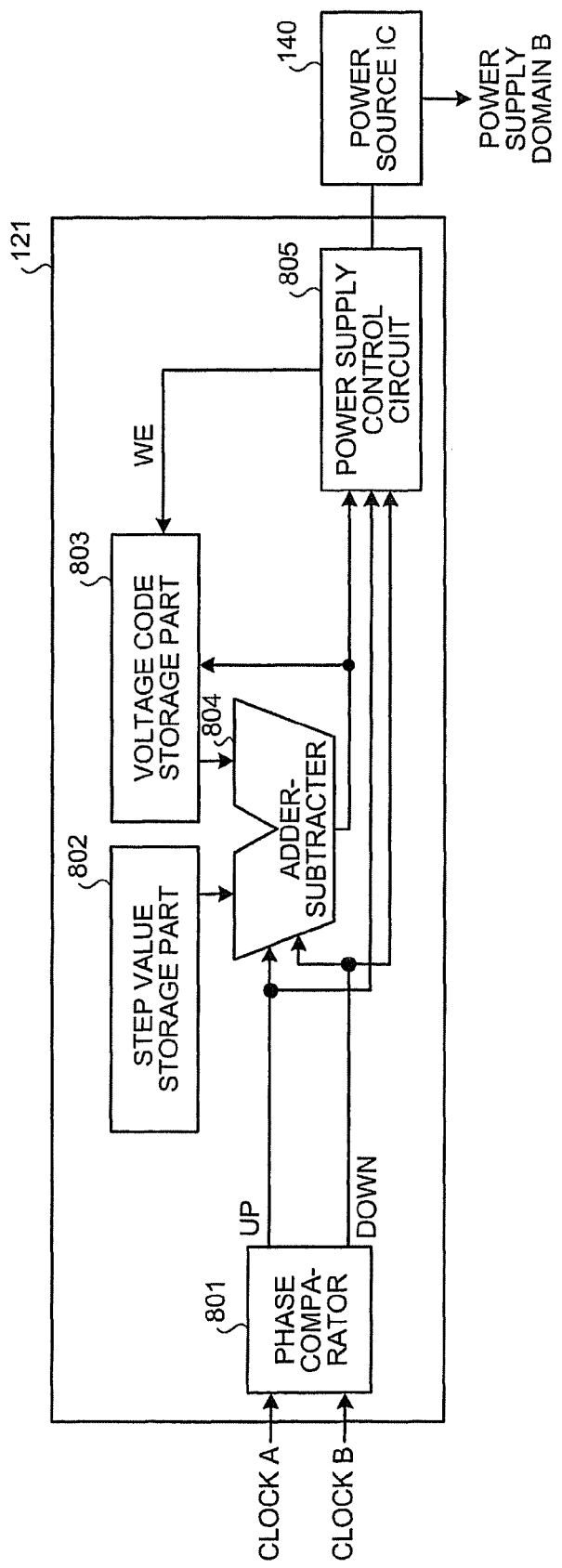
FIG. 8 is a block diagram of a configuration of a phase adjusting ASV control part.

The power supply voltage setting process for the power supply domain B module 120 described in FIGS. 6 and 7 is executed by the phase adjusting ASV control part 121 of the power supply domain B module 120. Therefore, a configuration of the phase adjusting ASV control part 121 included in the power supply domain B module 120 will be described in detail. FIG. 8 is a block diagram of a configuration of the phase adjusting ASV control part. As depicted in FIG. 8, the phase adjusting ASV control part 121 includes a phase comparator 801, a step value storage part 802, a voltage code storage part 803, an adder-subtracter 804, and a power supply control circuit 805.

The phase comparator 801 compares the phases of the clock signal (clock A) flowing through the power supply domain A module 110 and the clock signal (clock B) flowing through the power supply domain B module 120. As a result of this comparison, if the phase of the clock B has advanced more, an output signal DOWN is turned to "High" and conversely, if the phase of the clock A has advanced more, an output signal UP is turned to "High" and the respective signals are output to the adder-subtracter 804.

The step value storage part 802 stores a change step value at the time of the adjustment of the power supply voltage. The change step value is a part of adjustment when the power supply voltage is increased or reduced. For example, a step value of 0.01 [V] is stored. The voltage code storage part 803 stores a power supply voltage code corresponding to the current value of the power supply voltage. The power supply voltage code is a code representative of a value of the power supply voltage currently supplied to the power supply domain B module 120. Since the power supply voltage is assumed to be in a non-adjusted state in this example, a code representative of the reference power supply voltage (B)=0.8 [V] is stored.

The adder-subtracter 804 adds or subtracts the change step value stored in the step value storage part 802 to/from the power supply voltage code stored in the voltage code storage part 803. The power supply control circuit 805 controls the adder-subtracter 804 and outputs to the power source IC 140, an instruction for changing the power supply voltage. The power supply control circuit 805 outputs a WE signal for adjusting the power supply voltage code stored in the voltage code storage part 803 according to changes in the power supply voltage supplied to the power supply domain B module 120.

Figure 9:
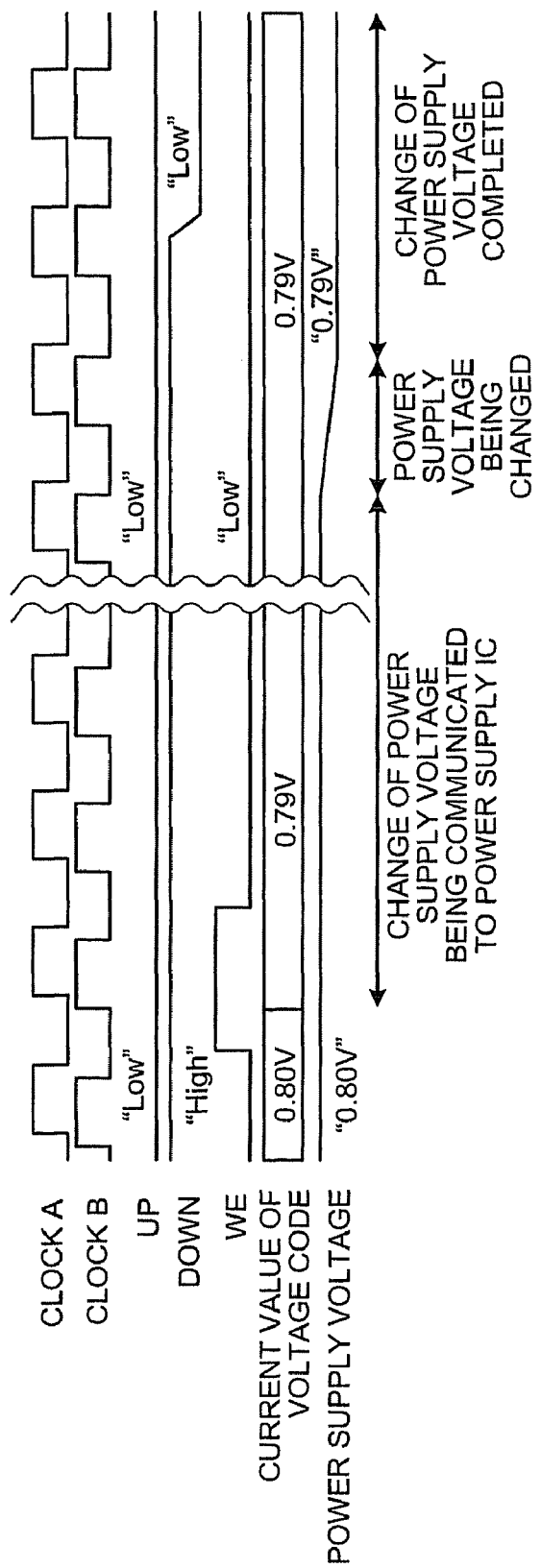
FIG. 9 is a timing chart of an exemplary operation of the phase adjusting ASV control part.

FIG. 9 is a timing chart of an exemplary operation of the phase adjusting ASV control part. As depicted in FIG. 9, if the clock B has advanced more than the clock A, the output signal DOWN of the phase comparator 801 is turned to "High" to perform an operation of reducing the power supply voltage by one step. The adder-subtracter 804 works as an adder when the output signal UP of the phase comparator 801 is "High" and as a subtracter when the output signal DOWN is "High".

Since the step value storage part 802 stores the change step value of 0.01 [V] as described above, the adder-subtracter 804 outputs the power supply voltage code of 0.79 [V] obtained by subtracting 0.01 [V], i.e., one step from 0.80 [V]. The power supply control circuit 805 outputs to the power source IC 140, an instruction for changing the power supply voltage to 0.79 [V] and outputs the WE signal="High" to the voltage code storage part 803. The WE signal causes the value stored in the voltage code storage part 803 to be changed to and stored as a power supply voltage code corresponding to 0.79 [V].

The power source IC 140 instructed, by the power supply control circuit 805, to change the power supply voltage changes the power supply voltage to 0.79 [V]. As described, the phase adjusting ASV control part 121 is configured to compare the phases of the clock signals (clock A, clock B) at the ends of the clock trees of the power supply domains, determine which has advanced more, and reduce or increase the power supply voltage depending on the result thereof.

Figure 10:
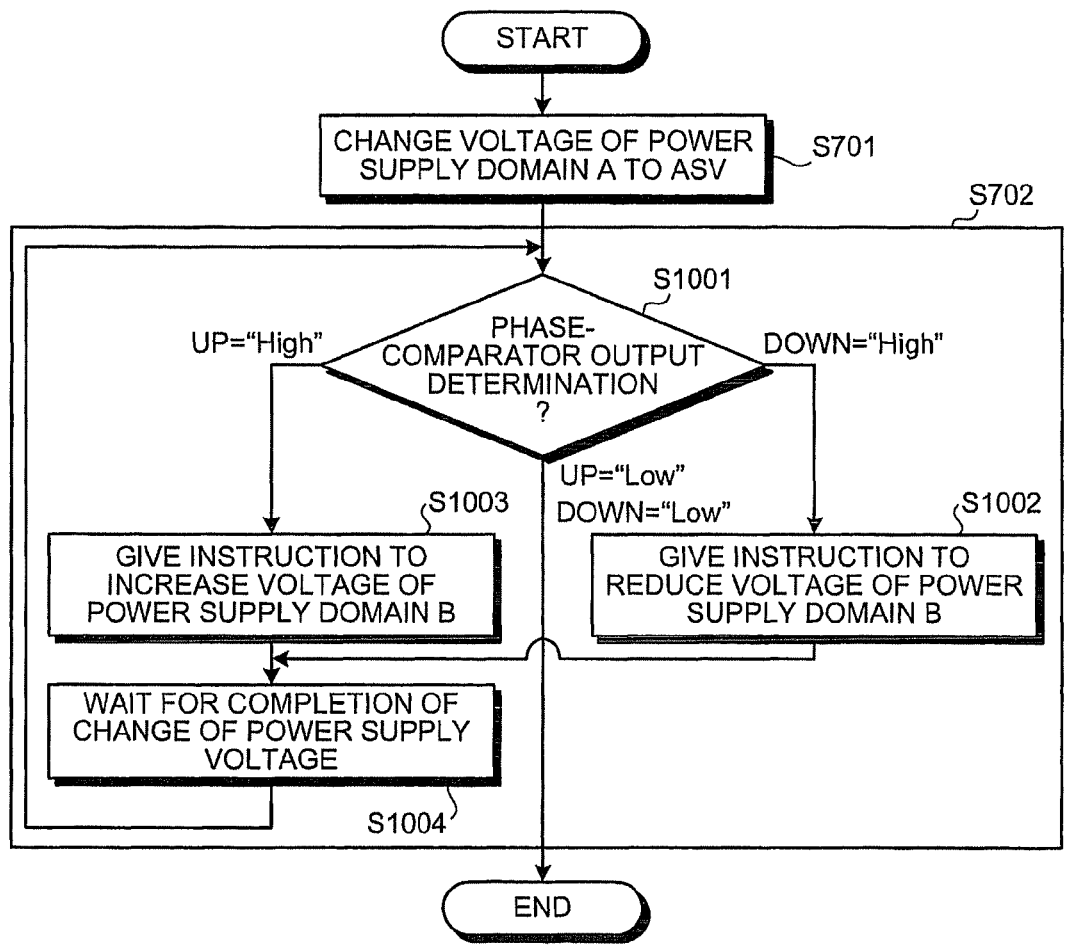
FIG. 10 is a flowchart of a power supply voltage changing process in the power supply voltage adjustment of the power supply domain B module.

FIG. 10 is a flowchart of the power supply voltage changing process in the power supply voltage adjustment of the power supply domain B module. First, the reference power supply voltage A of the power supply domain A module 110 is changed to the adjustment power supply voltage ASV. Subsequently, the phase comparator 801 determines the output with respect to the two clock signals (clock A, clock B) (step S1001).

At step S1001, if the output signal DOWN="High", an instruction is output to reduce the power supply voltage supplied to the power supply domain B module 120, i.e. an instruction for reducing the voltage by one step is output (step S1002). Subsequently, after waiting until the power source IC 140 completes the change of the power supply voltage (step S1004), the process returns to step S1001 to perform the output determination by the phase comparator 801. If the output signal DOWN="High" again, the power supply voltage of the domain B is reduced one step.

At step S1001, if the output signal UP="High", an instruction is output to increase the power supply voltage supplied to the power supply domain B module 120, i.e. an instruction for increasing the voltage by one step is output (step S1003). Subsequently, after waiting until the power source IC 140 completes the change of the power supply voltage (step S1004), the process returns to step S1001 to perform the output determination by the phase comparator 801. If the output signal UP="High" again, the power supply voltage of the domain B is increased one step.

When the result of the output determination of the phase comparator 801 is UP="Low" and DOWN="Low" at step S1001, the two clock signals (clock A, clock B) are synchronized and therefore, the power supply voltage of the power supply domain B module 120 is the adjusted voltage, i.e., the adjustment power supply voltage (ASV-B), and a series of processes ends. The processes at steps S1001 to S1004 correspond to the process at step S702 of the flowchart of FIG. 7.

The output signal turning to "High" corresponds to a case when too much time is required to change the power supply voltage from the upper limit to the lower limit and so the time required to change the power supply voltage is reduced to ½ by setting the initial value of the current value of the power supply voltage code to an intermediate value.

As described above, the multiple power source LSI 100 of the first embodiment adjusts the power supply voltage with the use of the phase difference of the clock signals between the different power supply domain modules. Therefore, the processes concerning the power supply voltage are considerably reduced as compared to conventional technologies.

For example, for example, if the respective ASVs of power supply domains included in the multiple power source LSI 100 are adjusted to fall within an allowable range, the number of times I delay analysis is performed is defined by equation (2), assuming that the number of process variation conditions is J=5, the number of power supply voltage conditions of the power supply domains is K=5, and the number of the power supply domains is L=4.

$$I=J\times K^L=5\times 5^4=3125 \text{ [times]} \quad (2)$$

If one delay analysis takes one hour, 3125 hours are required. Therefore, according to the embodiment, the process taking 10 days in the case of 10 computers arranged to operate in parallel may be reduced by the number K of the power supply voltage conditions. If the power supply voltage dependency characteristics of the respective process variation conditions as depicted in FIG. 3 have been obtained through circuit simulations, the process may also be reduced by the number J of the process variation conditions.

As described above, if the difference of the manufacturing variation and the power supply voltage dependency is negligible for delay times of the clock tree path and the logic path, the multiple power source LSI 100 of the first embodiment may adjust the power supply voltages of the power supply domains to suitable power supply voltages according to the manufacturing variations with a fewer number of processes.

Figure 19:
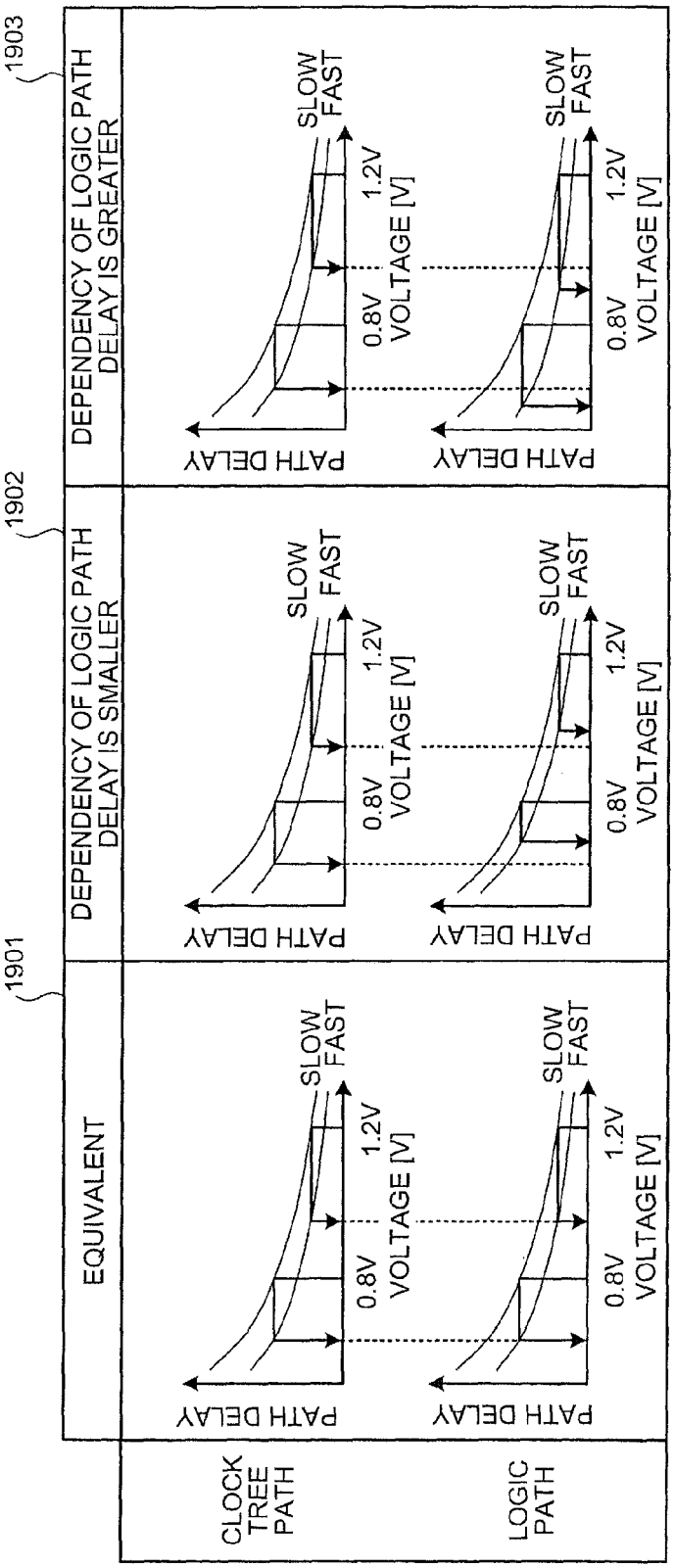
FIG. 19 is an explanatory diagram of delay times of a clock tree path and a logic path.

In a second embodiment, the power supply voltage adjustment is performed with consideration of the manufacturing variation dependency and the power supply voltage dependency. As depicted in the charts 1902 and 1903 of FIG. 19, if the manufacturing variation dependency and the power supply voltage dependency are considerably different for delay times of the clock tree path and the logic path and the difference is not negligible, the ASV may be obtained taking the difference into consideration.

Power supply voltage adjustment that takes manufacturing variation dependency the power supply voltage dependency into consideration will be described. The configuration of the multiple power source LSI 100 of the second embodiment is identical to the configuration of the first embodiment and will not be described. In the second embodiment, the ASV control part 111 and the phase adjusting ASV control part 121 also function as the power supply voltage adjusting apparatus according to the embodiment.

Figure 11:
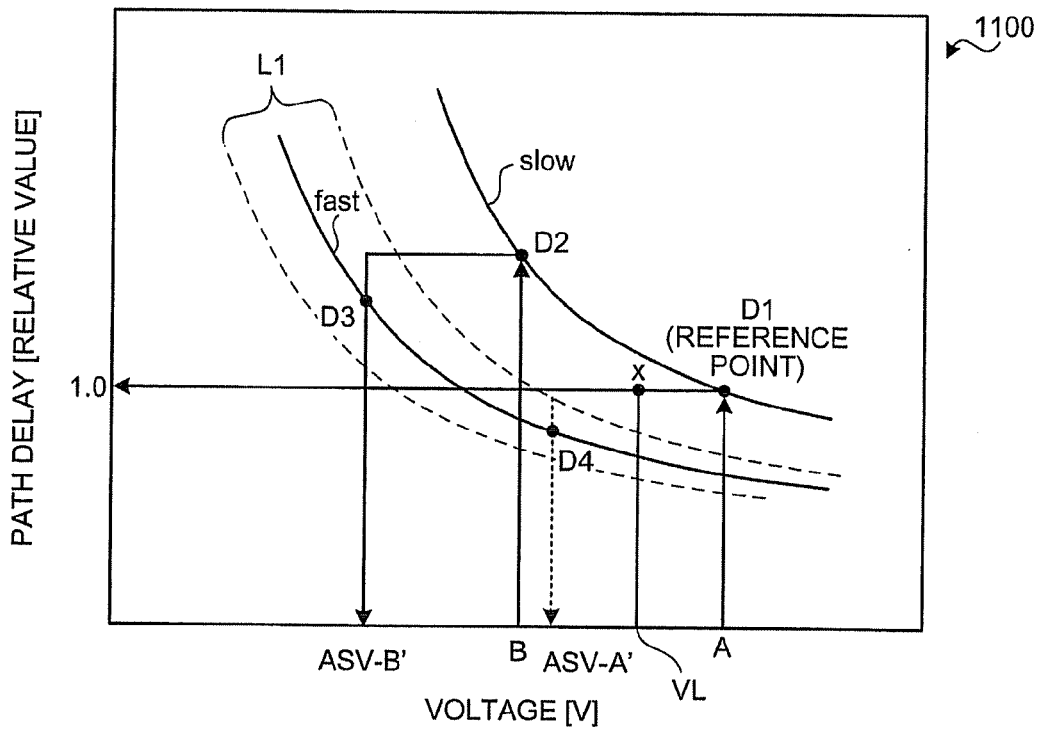
FIGS. 11 and 12 are charts for a power supply voltage adjustment technique that takes into consideration manufacturing variation dependency and power supply voltage dependency.
Figure 12:
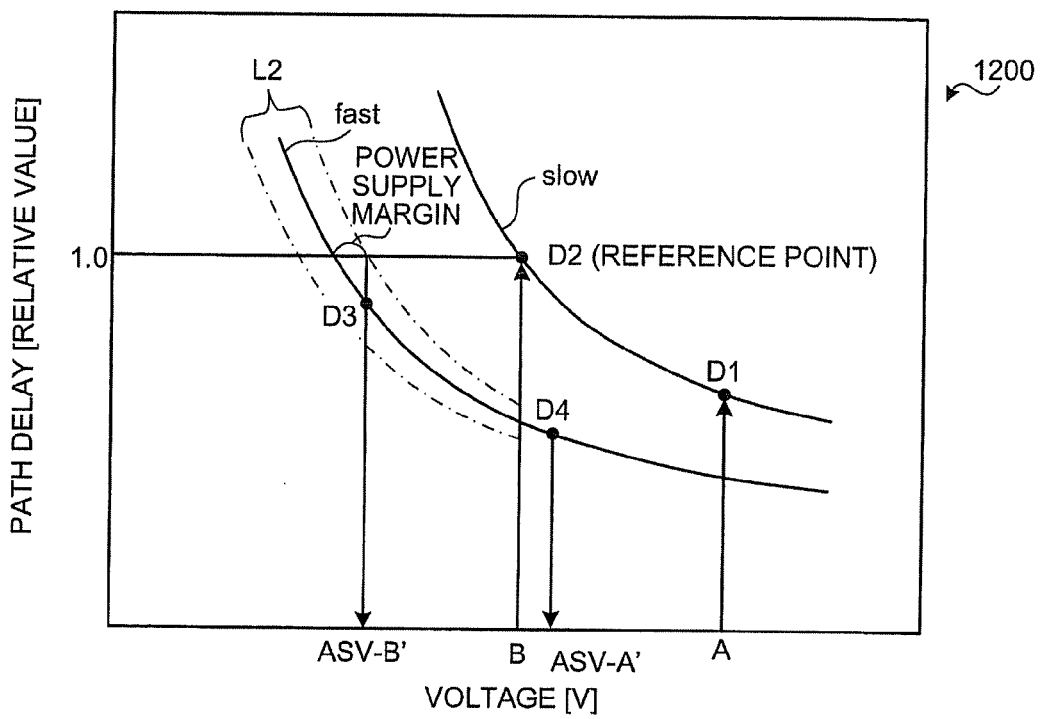
Figure 17:
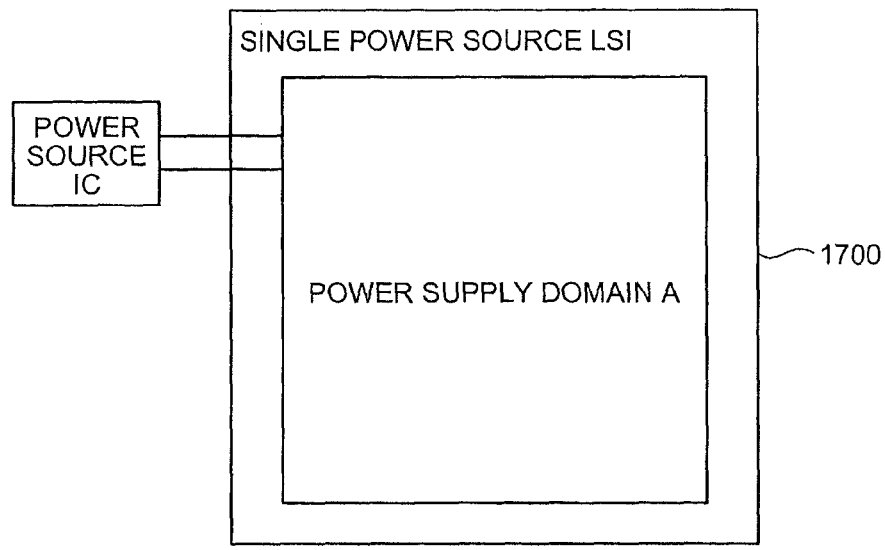
FIG. 17 is a block diagram of an exemplary configuration of a conventional single power source LSI.
Figure 18:
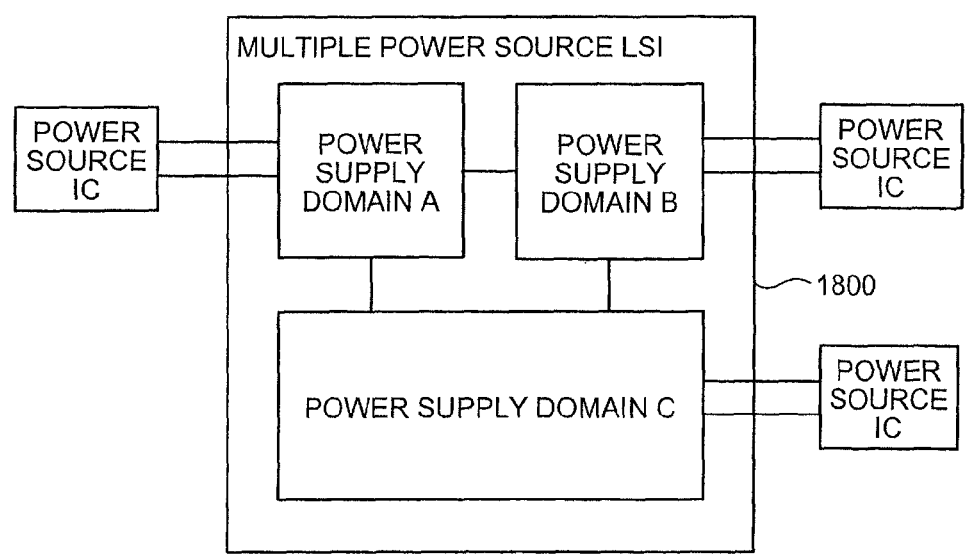
FIG. 18 is a block diagram of an exemplary configuration of a conventional multiple power source LSI.

FIGS. 11 and 12 are charts for the power supply voltage adjustment technique that takes into consideration manufacturing variation dependency and power supply voltage dependency. In the second embodiment, the reference power supply voltage (A) is a reference point as depicted in FIG. 11 and the reference power supply voltage (B) is a reference point as depicted in FIG. 12.

As described above, consideration is given to the manufacturing variation dependency in addition to the power supply voltage dependency of the path delay according to the second embodiment. Even if the power supply voltage dependency of the path delay is obtained through a circuit simulation, the path delay further fluctuates depending on the manufacturing variation. Therefore, this fluctuation range may be generated as a power supply voltage margin to set the power supply voltage giving consideration to the manufacturing variation corresponding to the power supply voltage margin. For example, the power supply voltage within an operative frequency range may be supplied to prevent malfunction by supplying the module with a margin adjustment power supply voltage that is the power supply voltage reduced by the power supply voltage margin.

Therefore, in the second embodiment, the following two-stage process is performed for adjustment of the power supply voltages of two power supply domain modules with consideration of the power supply voltage margin as described above, a first stage of generating the power supply voltage margin; and a second stage of adjusting the power supply voltage with consideration of the power supply voltage margin.

FIG. 13 is a flowchart of a power supply voltage margin generating process. As depicted in the flowchart of FIG. 13, first, the process variations and the power supply voltage dependency of the path delay time of the clock tree path are obtained (step S1301). With the process at step S1301, the power supply voltage dependency characteristics (characteristic curves "fast" and "slow") may be obtained for the respective process variations indicated by solid lines in the charts 1100 and 1200 (see FIGS. 11 and 12).

The range of the delay value under the fast condition is then obtained using the reference power supply voltage (B) as a reference point according to the manufacturing variation of the power supply domain B module 120 (step S1302). The range of the delay value obtained at step S1302 represents the fluctuation range of the delay value under the fast condition with consideration of the manufacturing variation of the power supply domain B module 120. This range of the delay value corresponds to a range L2 represented by dot-and-dash curves in a chart 1200 of FIG. 12.

In the chart 1200, a delay value D3 of the clock tree path is obtained for a voltage generating the delay value D2 to be less than the worst logic path delay (step S1303). The delay value D3 is obtained in such a way that the delay value is not generated as a value equal to or greater than D2 (reference point: 1.0) even when the fluctuation range of the range L2 is considered. The delay value D3 corresponds to the delay point D3 depicted in the chart 1200.

As depicted in the chart 1200, an adjustment power supply voltage (ASV-A') of a delay value D4 is determined such that a delay ratio of D1:D2=a delay ratio of D4:D3 (step S1304). Subsequently, a range of the delay value under the fast condition is then obtained using the reference power supply voltage (A) in the chart 1100 of FIG. 11 as a reference (step S1305).

The range of the delay value under the fast condition using the reference power supply voltage (A) at step S1305 represents the fluctuation range of the delay value under the fast condition with consideration of the manufacturing variation of the power supply domain A module 110. This range of the delay value corresponds to a range L1 represented by dash curves depicted in the chart 1100 of FIG. 11.

At step S1305, if the worst value of the path delay at D4 is greater than the delay value (reference point) at the delay value D1 of the reference power supply voltage (A), a voltage generating a delay value not greater than the delay value D1 is defined as the lowest voltage. With respect to chart 1100, the lowest voltage is a power supply voltage VL corresponding to a delay value at a point x on the reference point (1.0).

After the process at step S1305 is completed, the delay value D4 is obtained for each set of power supply voltages. The highest voltage corresponding to the obtained delay values D4 is adopted as a margin adjustment power supply voltage (ASV-A') (step S1306). After a series of above processes is completed, the ASV control part 111 adjusts the power supply voltage of the power supply domain A module 110 to the margin adjustment power supply voltage (ASV-A'). The adjustment process for the margin adjustment power supply voltage (ASV-A') will be described hereinafter).

When the power supply voltage of the power supply domain A module 110 is set, a shift is made to the adjustment process of the power supply voltage of the power supply domain B module 120. The adjustment process of the power supply voltage of the power supply domain B module 120 is basically executed by the phase adjusting ASV control part 121 as described in the first embodiment. Since the margin adjustment power supply voltage (ASV-A') is a value that takes the power supply voltage margin into consideration, the voltage at the delay value D3 is automatically set to the margin adjustment power supply voltage (ASV-A') by executing the adjustment process of the power supply voltage of the power supply domain B module 120 such that the relationship of the delay ratio is retained.

FIG. 14 is a chart for a power supply voltage adjustment technique that takes the power supply voltage margin into consideration. A chart 1400 depicts power supply voltage dependency characteristics (characteristic curves "fast" and "slow") of the respective process variations.

As described with reference to FIGS. 4 and 5 of the first embodiment, the adjustment power supply voltage (ASV-A) is set through the power supply voltage setting process by the power supply domain A module 110. The adjustment power supply voltage (ASV-A) is then adjusted by the power supply voltage margin generated according to the technique described with reference to FIGS. 11 to 13 to obtain the margin adjustment power supply voltage (ASV-A') adapted to the manufacturing variation of the power supply domain A.

FIG. 15 is a flowchart of a power supply voltage adjustment process that takes the power supply voltage margin into consideration. As depicted in the flowchart of FIG. 15, first, the process variations and the power supply voltage dependency of the path delay time of the clock tree path are obtained (step S1501). At step S1501, to obtain the process variations and the power supply voltage dependency, a circuit simulation may be performed using the design data of the multiple power source LSI 100 or a characteristic test may actually be performed by the multiple power source LSI 100.

The delay value D1 of the slow condition of the clock tree path is then obtained with the reference power supply voltage (A) (step S1502). Finally, the margin adjustment power supply voltage (ASV-A') generating the delay value D4 is obtained from the power supply voltage margin generated at S1301 to S1306 of FIG. 13 (step S1503), and a series of processes ends.

Once the margin adjustment power supply voltage (ASV-A') is obtained, the ASV control part 111 outputs an instruction signal to the power source IC 130 to supply the margin adjustment power supply voltage (ASV-A') to the power supply domain A module 110.

As described above, the multiple power source LSI 100 of the second embodiment regards the power supply voltage value including the power supply voltage margin as the margin adjustment power supply voltage (ASV-A') that is a power supply voltage adapted to the manufacturing variation of the power supply domain A module 110. Even when the power supply voltage of the power supply domain A module 110 is set to the margin adjustment power supply voltage (ASV-A') in this way, the phase comparator 801 maintains a delay ratio of D1:D2=a delay ratio of D4:D3 and therefore, the power supply voltage of the power supply domain B module 120 is automatically set to a margin power supply voltage (ASV-B').

Thus, when the process variation condition is the fast condition, since the clock signals flowing through the power supply domain A module 110 and the power supply domain B module 120 have no clock skew and the power supply voltages are set to values with consideration of the power supply voltage margin, the circuit of the path between the power supply domain A module 110 and the power supply domain B module 120 may be operated normally. The circuits of the power supply domain A module 110 internal path and the power supply domain B module 120 internal path may also be operated normally.

Since the ASV of the power supply domain acting as a reference is determined with consideration of a difference of the manufacturing variation and the power supply voltage dependency for delay times of the clock tree path and the logic path, the ASV may be obtained without malfunction of an LSI having multiple power supply domains even if the difference of the manufacturing variation and the power supply voltage dependency is not negligible for delay times of the clock tree path and the logic path.

As described, the multiple power source LSI 100 of the second embodiment may make an adjustment to suitable power supply voltages with consideration of the manufacturing variation dependency and the power supply voltage dependency by a fewer number of processes.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

What is claimed is:

1. A power supply voltage adjusting apparatus comprising:
   a voltage setting part that, according to a characteristic variation of a semiconductor integrated circuit, sets a first power supply voltage of a first power supply domain module among a plurality of modules in the semiconductor integrated circuit, each module respectively having a different power supply voltage;

a detecting part that compares phases of a first clock signal flowing through the first power supply domain module and a second clock signal flowing through a second power supply domain module to detect a phase difference; and a voltage adjusting part that adjusts a second power supply voltage supplied to the second power supply domain module to reduce the phase difference detected by the detecting part, wherein the voltage setting part includes a margin detecting part that detects a difference between a variation dependency and a power supply voltage dependency of delay of the first clock signal as a margin representative of a fluctuation range of the delay of the first clock signal and sets the first power supply voltage of the first power supply domain module to a third power supply voltage obtained by subtracting the margin from the first power supply voltage, the detecting part compares phases of the first clock signal and the second clock signal to detect a phase difference, when the first power supply voltage of the first power supply domain module is set to the third power supply voltage, and the voltage adjusting part adjusts the second power supply voltage supplied to the second power supply domain module to reduce the phase difference detected by the detecting part when the first power supply voltage of the first power supply domain module is set to the third power supply voltage.

2. The power supply voltage adjusting apparatus according to claim 1, wherein the voltage adjusting part increases the second power supply voltage if the detecting part detects a phase difference due to delay of the second clock signal, and reduces the second power supply voltage in case that the detecting part detects a phase difference due to delay of the first clock signal.

3. The power supply voltage adjusting apparatus according to claim 1, wherein the voltage setting part acquires a first upper limit value and a first lower limit value of a power supply voltage that enables normal operation of the first power supply domain module, sets the first upper limit value to the first power supply voltage if the first power supply voltage is equal to or exceeds the first lower limit value, and sets the first lower limit value to the first power supply voltage if the first power supply voltage is equal to or less than the first lower limit value.

4. The power supply voltage adjusting apparatus according to claim 1, wherein the voltage adjusting part acquires a second upper limit value and a second lower limit value of a power supply voltage that enables normal operation of the second power supply domain module, adjusts the second power supply voltage to the second upper limit value if the second power supply voltage is equal to or greater than the second upper limit value, and adjusts the second power supply voltage to the second lower limit value if the second power supply voltage is equal to or smaller than the second lower limit value.

5. A power supply voltage adjusting method comprising:

setting, according to a characteristic variation of a semiconductor integrated circuit, a first power supply voltage of a first power supply domain module among a plurality of modules in the semiconductor integrated circuit, each module respectively having a different power supply voltage;

comparing phases of a first clock signal flowing through the first power supply domain module and a second clock signal flowing through a second power supply domain module;

detecting a phase difference based on a comparison result at the comparing;

adjusting a second power supply voltage supplied to the second power supply domain module to reduce the phase difference detected at the detecting, wherein said setting detects a difference between a variation dependency and a power supply voltage dependency of delay of the first clock signal as a margin representative of a fluctuation range of the delay of the first clock signal, and sets the first power supply voltage of the first power supply domain module to a third power supply voltage obtained by subtracting the margin from the first power supply voltage, said comparing compares phases of the first clock signal and the second clock signal to detect a phase difference, when the first power supply voltage of the first power supply domain module is set to the third power supply voltage, and said adjusting adjusts the second power supply voltage supplied to the second power supply domain module to reduce the phase difference detected by said comparing when the first power supply voltage of the first power supply domain module is set to the third power supply voltage.

6. An apparatus comprising:

a voltage setting part that detects a difference between a variation dependency and a power supply voltage dependence of delay of a first clock signal flowing through a first power supply domain module among a plurality of modules in a semiconductor integrated circuit, each of the plurality of modules respectively having a different power supply voltage, the detected difference being a margin representative of a fluctuation range of the delay of the first clock signal, subtracts said difference from a power supply voltage being supplied to the first power supply domain module to thereby obtain a new power supply voltage, and sets the new power supply voltage so that the new power supply voltage is supplied to the first power supply domain module;

a detecting part that, when the new power supply voltage is supplied to the first power supply domain module, compares phases of the first clock signal and a second clock signal flowing through a second power supply domain module among the plurality of modules, to detect a phase difference; and a voltage adjusting part that adjusts a power supply voltage supplied to the second power supply domain module to reduce the detected phase difference.

* * * * *